United States Patent [19]

Takeuchi

[11] Patent Number: 5,686,865
[45] Date of Patent: Nov. 11, 1997

[54] PHASE SYNCHRONOUS CIRCUIT

[75] Inventor: Hiroshi Takeuchi, Tokyo, Japan

[73] Assignee: NEC Corporation, Tokyo, Japan

[21] Appl. No.: 664,005

[22] Filed: Jun. 14, 1996

[30] Foreign Application Priority Data

Jun. 14, 1995  [JP]  Japan ................................. 7-147047

[51] Int. Cl.⁶ .................................. H03L 7/08; H03L 7/10
[52] U.S. Cl. .......................... 331/14; 331/1 A; 331/17; 327/159
[58] Field of Search ............................... 331/1 A, 14, 17, 331/23, 25; 329/325; 327/156–159; 455/208, 209, 214, 337

[56] References Cited

U.S. PATENT DOCUMENTS 5,170,135  12/1992  Ito et al. ................................ 331/25 X

Primary Examiner—David Mis
Attorney, Agent, or Firm—Young & Thompson

[57] ABSTRACT

A novel phase synchronous circuit includes a phase comparator, a first loop filter being electrically connected to the multiplying phase comparator, a second loop filter being electrically connected to the first loop filter, a voltage control oscillator being electrically connected to the second loop filter, an inventor circuit having an input side being electrically connected to the voltage control oscillator and a switching circuit having two input terminals and a single output terminal. The input terminal is electrically connected to the voltage control oscillator. The input terminal is electrically connected to an output terminal of the invertor circuit. The output terminal is electrically connected to an output terminal and also to an input side of the multiplying phase comparator. An input terminal is also electrically connected to another input of the multiplying phase comparator. Further, the novel phase synchronous circuit includes a hysteresis comparator having first and second inputs being electrically connected to an output side of the first loop filter and an output side of the second loop filter respectively. In the initial state, the switching circuit has an electrical connection between the input terminal and the output terminal.

6 Claims, 10 Drawing Sheets

PHASE SYNCHRONOUS CIRCUIT

BACKGROUND OF THE INVENTION

The present invention relates to a phase synchronous circuit, and more particularly to a phase synchronous circuit applicable to a frequency-modulation demodulator circuit.

One of conventional phase synchronous circuits is disclosed in the Japanese laid-open patent application No. 4-81126, which will be described with reference to FIG. 1. The conventional phase synchronous circuit includes a chopping wave property phase comparator 101, a loop filter 102 being electrically connected to the chopping wave property phase comparator 101, a voltage control oscillator 103 being electrically connected to the loop filter 102, an inventor circuit 104 having an input side being electrically connected to the voltage control oscillator 103 and a switching circuit 105 having two input terminals 105a and 105b and a single output terminal 105c. The input terminal 105a is electrically connected to the voltage control oscillator 103. The input terminal 105b is electrically connected to an output terminal of the invertor circuit 104. The output terminal 105c is electrically connected to a terminal 131 and also to an input side of the chopping wave property phase comparator 101. A terminal 130 is also electrically connected to another input of the chopping wave property phase comparator 101. Further, the conventional phase synchronous circuit includes a phase range detecting circuit 106 having an input side being electrically connected to the output side of the chopping wave property phase comparator 101 and an output side being electrically connected to the switching circuit 105. In the initial state, the switching circuit 105 has an electrical connection between the input terminal 105a and the output terminal 105c.

The above conventional phase synchronous circuit operates as follows. The chopping wave property phase comparator 101 fetches input signals from the input terminal 130 and the output Signal having outputted from the 105c for subjecting the input and output signals to a phase comparison to thereby detect a phase difference between the input and output signals. The chopping wave property phase comparator 101 supplies phase difference signals which identify the phase difference between the input and output signals. The loop filter 102 fetches the phase difference signals from the chopping wave property phase comparator 101 to thereby extract any beat waveforms that might be included in the phase difference signals. The loop filter 102 supplies a low pass signal 107 which indicates the beat waveform. The low pass signal 107 is received by the voltage control oscillator 103 to control oscillation frequency of the voltage control oscillator 103. An oscillation signal outputted from the voltage control oscillator 103 is transmitted to the invertor circuit 104 and the input terminal 105a of the switching circuits 105. The invertor circuit 104 inverts polarization of the signals for subsequent output of the inverted signal which is then transmitted to the input terminal 105b.

On the other hand, the phase range detection circuit 106 receives the phase difference signal as an output signal from the chopping wave property phase comparator 101 or the low pass signal outputted from the loop filter 102 for subsequent phase comparison thereof to detect the phase difference between them. If the phase difference between the input signal and the output signal is 3 $\pi/2$ radians, then the phase range detecting circuit 106 feeds a control signal to the switching circuit 105. If the switching circuit 105 receives the control signal from the phase range detecting circuit 106, then the connection between the input terminal 105a and the output 105c is shifted to another connection between the input terminal 105b and the output 105c whereby at the output terminal 131 the inverted signal from the output of the voltage control oscillator 103 appears.

The chopping waveform property of the chopping wave property phase comparator 101 is illustrated in FIG. 2. The above shift of the connection path from between the input terminal 105a and the output 105c to between the input terminal 105b and the output 105c makes the shift from a right-drop line crossing a point (3 $\pi/2$, 0) to a right-up line crossing a point ($\pi/2$, 0). This means that it is possible to compulsorily make a shift from the phase difference region unsuitable for control necessary for pull-in operation into a phase difference region suitable for control necessary for pull-in operation, to thereby curtail the necessary time for the pull-in operation and enlarge the phase difference range suitable for the pull-in operation. As to the switching circuit 105, the switching between the first connection path of the output terminal 105c to the input terminal 105a and the second connection path of the output terminal 105c to the input terminal 105b is made every when the phase difference reaches 3 $\pi/2$ radians.

The above phase range detecting circuit 106 may comprise digital circuits such as D-type flip flop circuits which has complicated circuit configurations. This D-type flip flop circuits make it difficult that the phase synchronous circuit shows a high speed performance.

SUMMARY OF THE INVENTION

Accordingly, it is an object of the present invention to provide a novel phase synchronous circuit free from any problems or disadvantages as described above.

It is a further object of the present invention to provide a novel phase asynchronous circuit having a relatively simple circuit configuration.

It is a furthermore object of the present invention to provide a novel phase synchronous circuit showing a high speed performance.

The above and other objects, features and advantages of the present invention will be apparent from the following descriptions.

A novel phase synchronous circuit includes a phase comparator, a first loop filter being electrically connected to the multiplying phase comparator, a second loop filter being electrically connected to the first loop filter, a voltage control oscillator being electrically connected to the second loop filter, an inventor circuit having an input side being electrically connected to the voltage control oscillator and a switching circuit having two input terminals and a single output terminal. The input terminal is electrically connected to the voltage control oscillator. The input terminal is electrically connected to an output terminal of the invertor circuit. The output terminal is electrically connected to an output terminal and also to an input side of the multiplying phase comparator. An input terminal is also electrically connected to another input of the multiplying phase comparator. Further, the novel phase synchronous circuit includes a hysteresis comparator having first and second inputs being electrically connected to an output side of the first loop filter and an output side of the second loop filter respectively. In the initial state, the switching circuit has an electrical connection between the input terminal and the output terminal.

A novel phase synchronous circuit includes a multiplying phase comparator, a loop filter being electrically connected to the multiplying phase comparator, a voltage control oscillator being electrically connected to the loop filter, an inventor circuit having an input side being electrically connected to the voltage control oscillator and a switching circuit having two input terminals and a single output terminal. The input terminal is electrically connected to the voltage control oscillator. The input terminal is electrically connected to an output terminal of the invertor circuit. The output terminal is electrically connected to an output terminal and also to an input side of the multiplying phase comparator. An input terminal is also electrically connected to another input of the multiplying phase comparator. Further, the novel phase synchronous circuit includes a hysteresis comparator having first and second inputs being electrically connected to an input side and an output side of the loop filter respectively. In the initial state, the switching circuit has an electrical connection between the input terminal and the output terminal.

BRIEF DESCRIPTIONS OF THE DRAWINGS

Preferred, embodiments according to the present invention will be described in detail with reference to the accompanying drawings.

PREFERRED EMBODIMENTS

Figure 1:
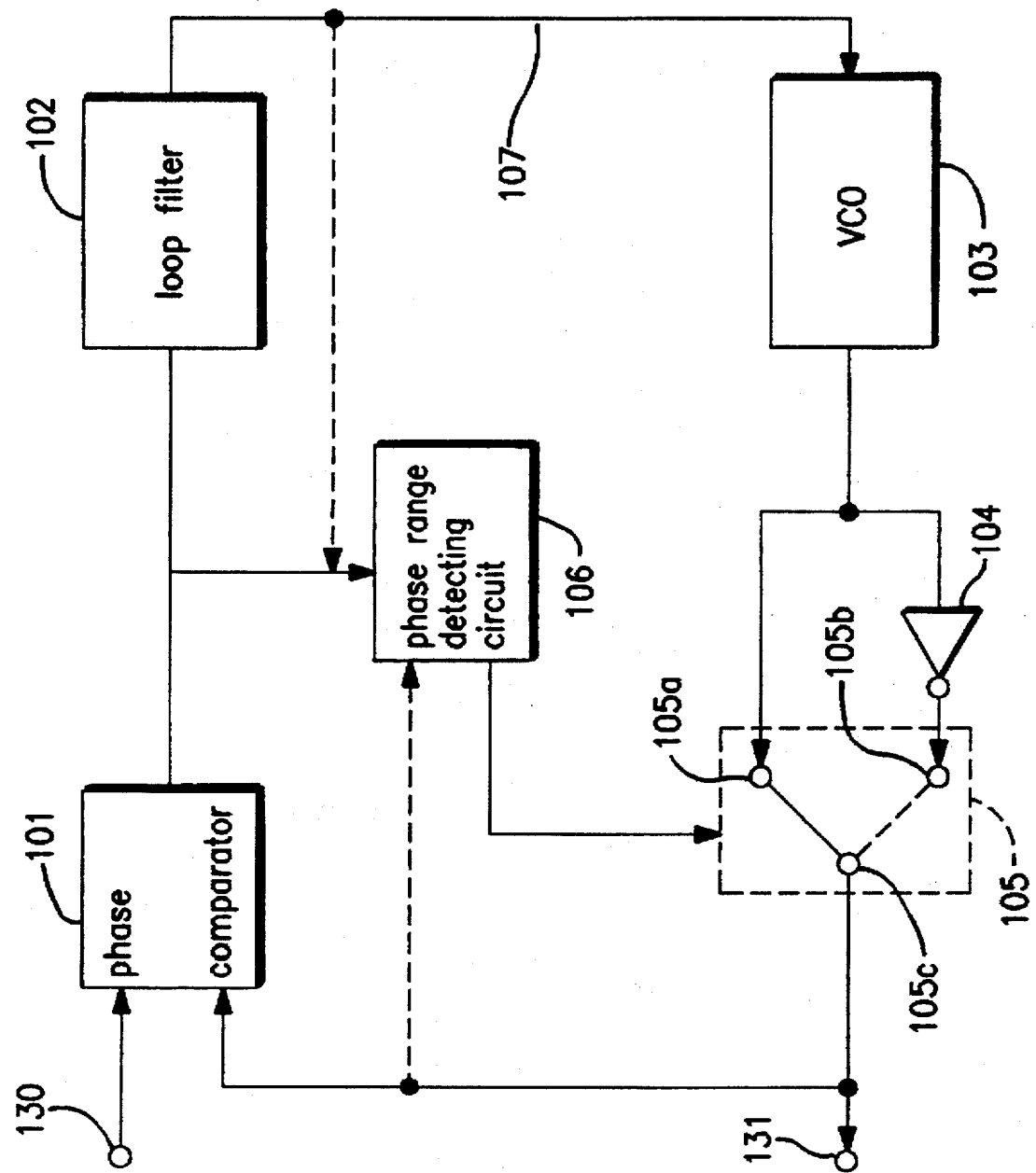
FIG. 1 is a circuit block diagram illustrative of the conventional phase synchronous circuit.
Figure 2:
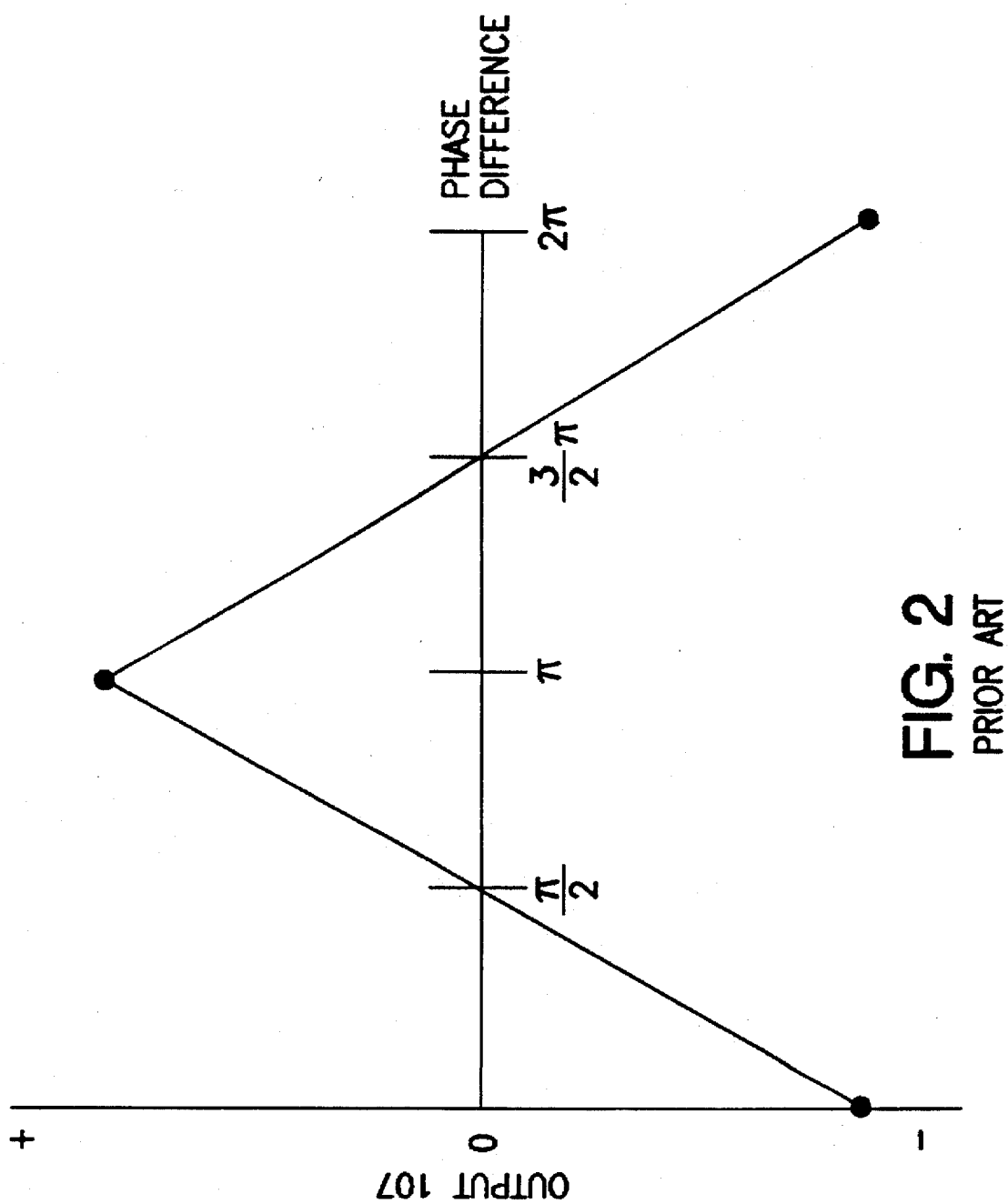
FIG. 2 is a diagram illustrative of an output property over phase differences for a phase comparator in the conventional phase synchronous circuit.
Figure 3:
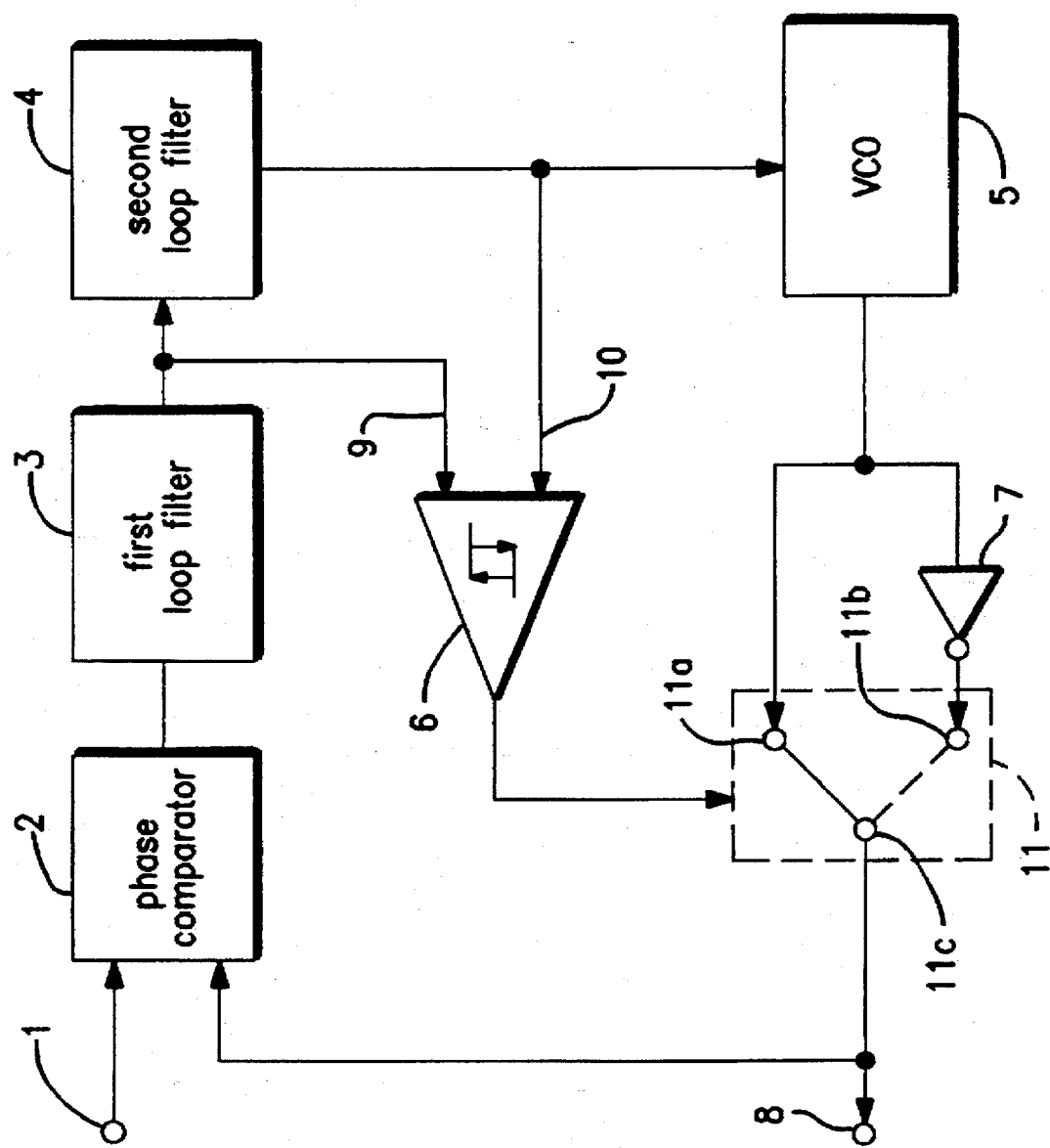
FIG. 3 is a circuit block diagram illustrative of a novel phase synchronous circuit in a first embodiment according to the present invention.

A first embodiment according to the present invention will be described with reference to FIGS. 3–6, wherein a novel phase synchronous circuit is provided.

The novel phase synchronous circuit includes a multiplying phase comparator 2, a first loop filter 3 being electrically connected to the multiplying phase comparator 2, a second loop filter 4 being electrically connected to the first loop filter 3, a voltage control oscillator 5 being electrically connected to the second loop filter 4, an inventor circuit 7 having an input side being electrically connected to the voltage control oscillator 5 and a switching circuit 11 having two input terminals 11a and 11b and a single output terminal 11c. The input terminal 11a is electrically connected to the voltage control oscillator 5. The input terminal 105b is electrically connected to an output terminal of the invertor circuit 7. The output terminal 11c is electrically connected to an output terminal 8 and also to an input side of the multiplying phase comparator 2. An input terminal 1 is also electrically connected to another input of the multiplying phase comparator 2. Further, the novel phase synchronous circuit includes a hysteresis comparator 6 having first and second inputs being electrically connected to an output side of the first loop filter 3 and an output side of the second loop filter 4 respectively. In the initial state, the switching circuit 11 has an electrical connection between the input terminal 11a and the output terminal 11c.

The above novel phase synchronous circuit operates as follows. The multiplying phase comparator 2 fetches input signals from the input terminal 1 and the output signal having outputted from the output terminal 11c of the switching circuit 11 for subjecting the input and output signals to a phase comparison to thereby detect a phase difference between the input and output signals. The multiplying phase comparator 2 supplies phase difference signals which identify the phase difference between the input and output signals. The first loop filter 3 fetches the phase difference signals from the multiplying phase comparator 2 to thereby extract any beat waveforms that might be included in the phase difference signals. The first loop filter 3 supplies a first low pass signal 9 which indicates the beat waveform. The first low pass signal 9 is received by the first input terminal of the hysteresis comparator 6. The second loop filter 4 fetches the low pass signal 9 from the first loop filter 3 to thereby make the first low pass signal 9 smooth and supply a second low pass signal 10 which indicates the beat waveform. The second low pass signal 10 is received by the second input terminal of the hysteresis comparator 6. The second low pass signal 10 is transmitted to the voltage control oscillator 5 to control the oscillator frequency of the voltage control oscillator 5. An oscillation signal outputted from the voltage control oscillator 5 is transmitted to the invertor circuit 7 and the input terminal 11a of the switching circuits 11. The invertor circuit 7 inverts polarization of the signals for subsequent output of the inverted signal which is then transmitted to the input terminal 11b of the switching circuits 11.

On the other hand, the hysteresis comparator 6 receives at the first input the first low pass signal 9 from the first loop filter 3 and at the second input the second low pass signal 10 from the second loop filter 4 for subsequent signal level comparison thereof to feeds a control signal to the switching circuit 11. If the switching circuit 11 receives the control signal from the hysteresis comparator 6, then the connection between the input terminal 11a and the output 11c is shifted to another connection between the input terminal 11b and the output 11c to thereby switch forward/reverse phases of the voltage control oscillator 103 appears.

Figure 4A:
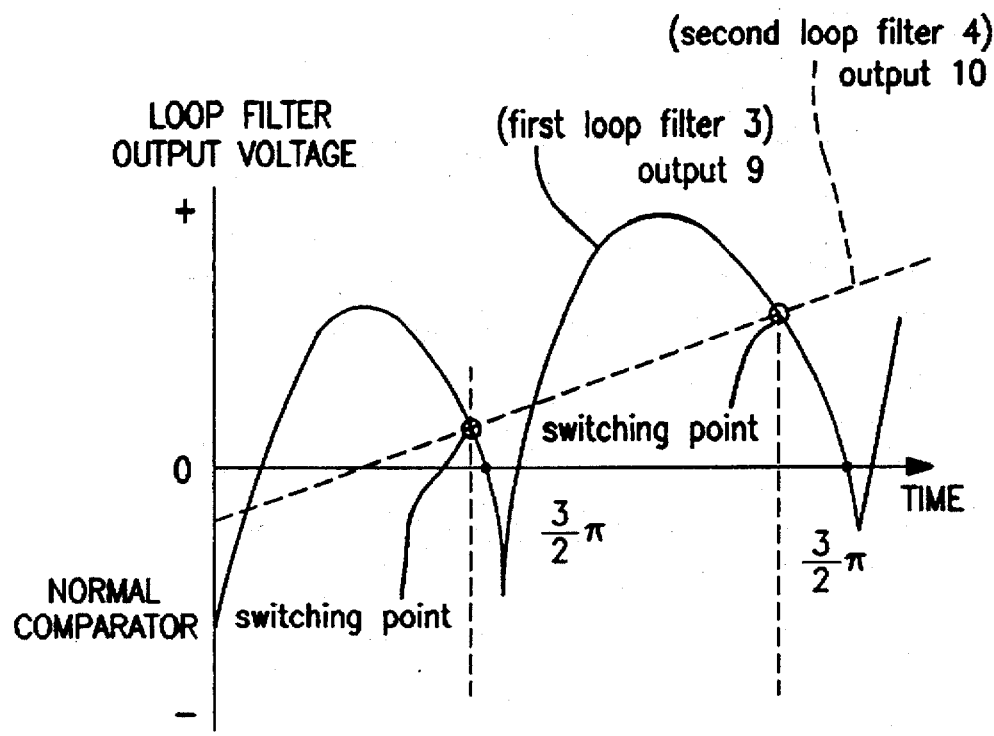
FIGS. 4A and 4B are diagrams illustrative of loop filter output voltage profiles over times during a process of pull-in control (+) when the normal comparator is used and a hysteresis comparator is used.
Figure 4B:
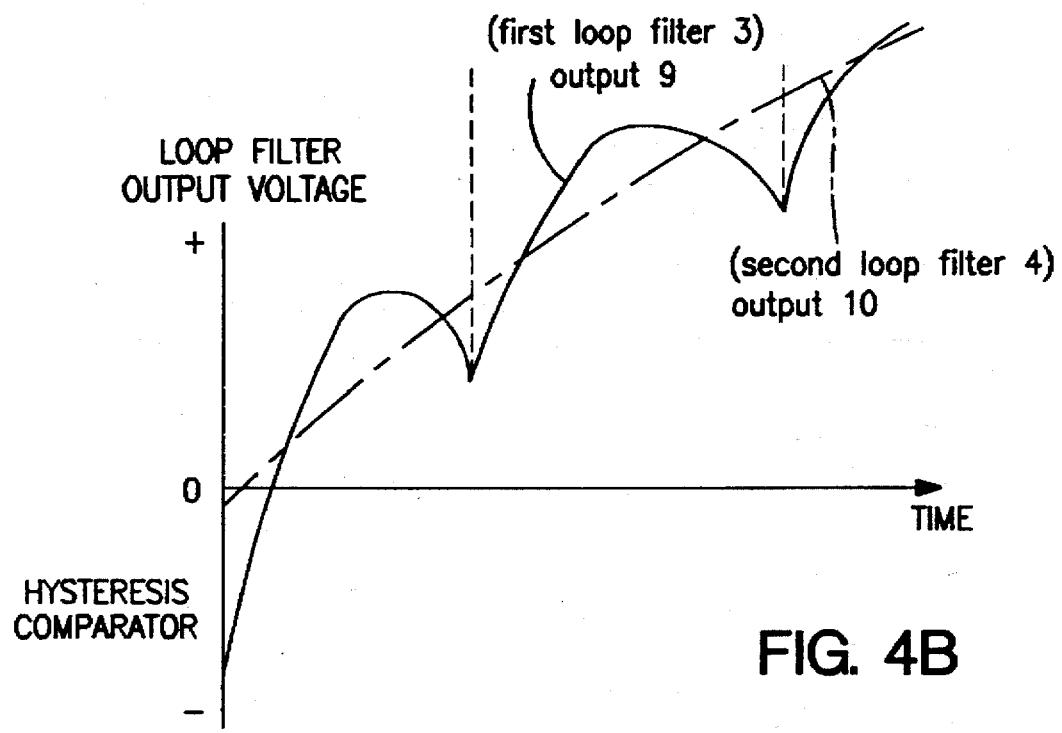

FIGS. 4A and 4B are illustrative of loop filter output voltage profiles over times during a process of pull-in control (+) when the normal comparator is used and a hysteresis comparator is used.

If the pull-in control operates to make the output of the loop filter plus, then the output voltage of the loop filter over phase differences of the output and input signals of the multiplying phase comparator are as illustrated in FIGS. 4A and 4B. When the hysteresis comparator is used, then the rate of increase in the output voltage level of the loop filter is larger than when the normal comparator without any hysteresis is used. This means that the phase difference region unsuitable for control necessary for pull-in operation is shifted into a phase difference region suitable for control necessary for pull-in operation, to thereby curtail the necessary time for the pull-in operation and enlarge the phase difference range suitable for the pull-in operation. When the level of the output 9 of the first loop filter 3 is below a predetermined level on the basis of the signal level of the second loop filter 4, the control in the reverse direction of the phase difference range is shifted to the control in the forward direction of the phase difference range.

Figure 5A:
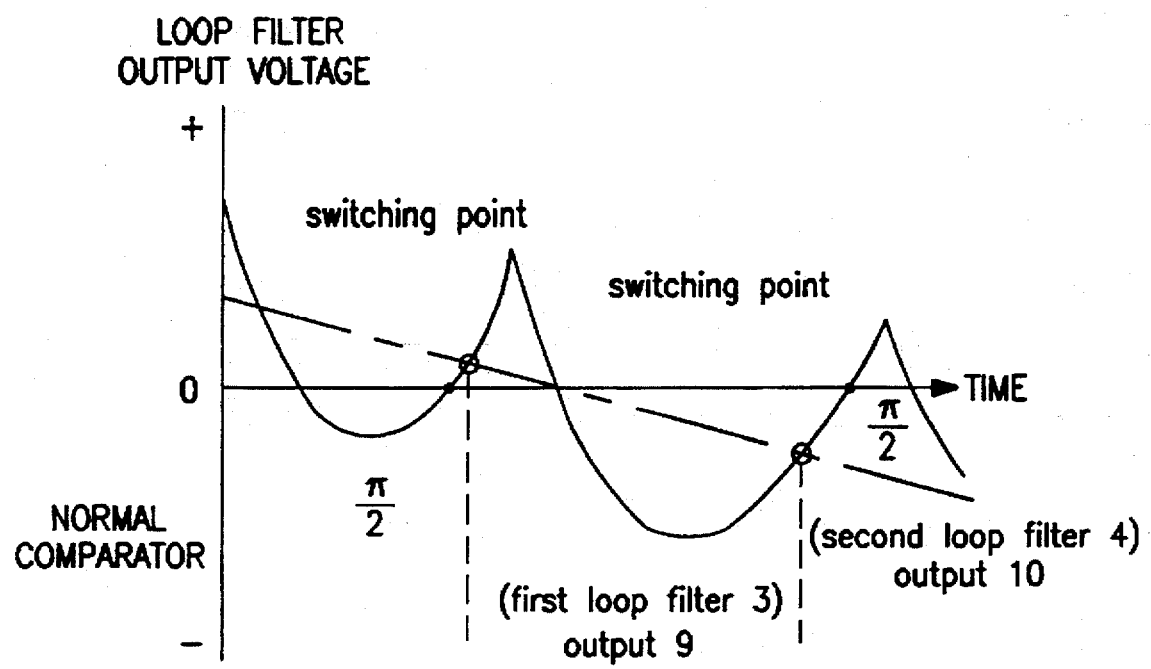
FIGS. 5A and 5B are diagrams illustrative of loop filter output voltage profiles over times during a process of pull-in control (−) when the normal comparator is used and a hysteresis comparator is used.
Figure 5B:
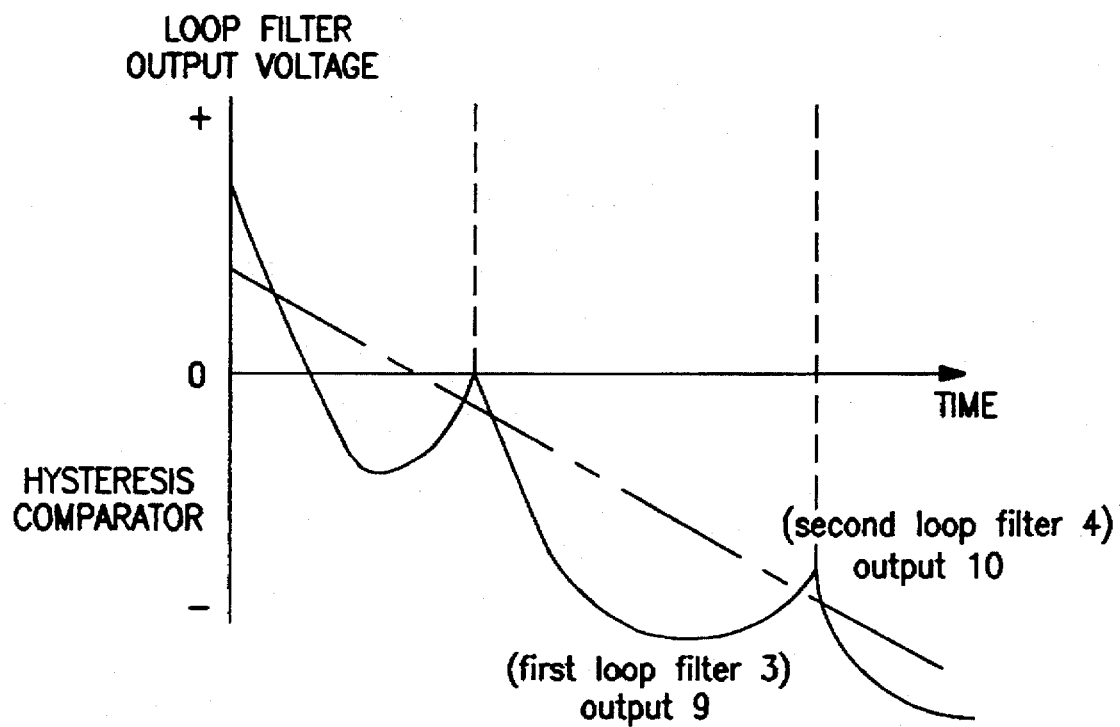

FIGS. 5A and 5B are illustrative of loop filter output voltage profiles over times during a process of pull-in control (–) when the normal comparator is used and a hysteresis comparator is used.

If the pull-in control operates to make the output of the loop filter plus, then the output voltage of the loop filter over phase differences of the output and input signals of the multiplying phase comparator are as illustrated in FIGS. 5A and 5B. When the hysteresis comparator is used, then the rate of decrease in the output voltage level of the loop filter is larger than when the normal comparator without any hysteresis is used. This means that the phase difference region unsuitable for control necessary for pull-in operation is shifted into a phase difference region suitable for control necessary for pull-in operation, to thereby curtail the necessary time for the pull-in operation and enlarge the phase difference range suitable for the pull-in operation. When the level of the output 9 of the first loop filter 3 is below a predetermined level on the basis of the signal level of the second loop filter 4, the control in the reverse direction of the phase difference range is shifted to the control in the forward direction of the phase difference range.

Figure 6:
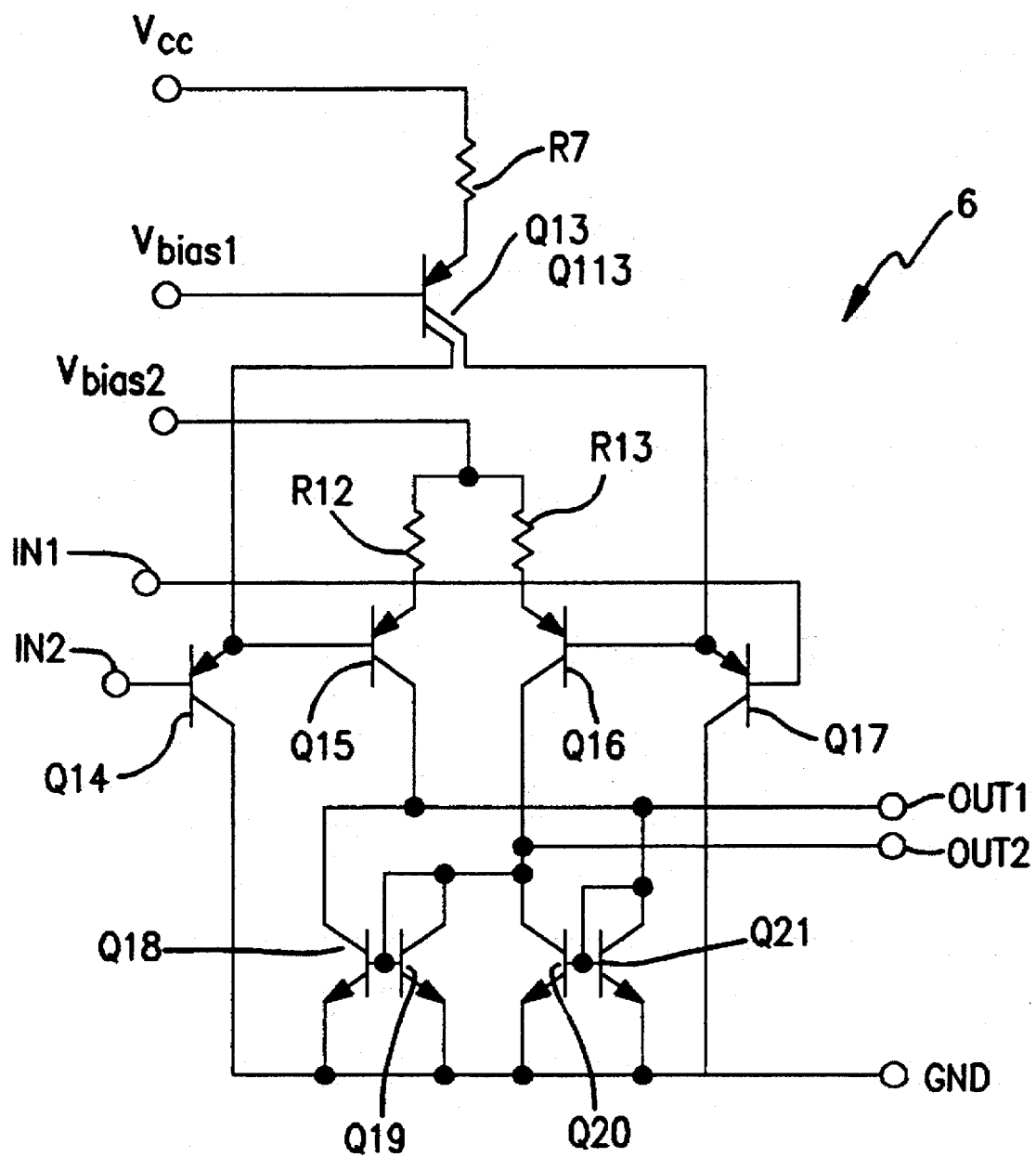
FIG. 6 is a circuit diagram illustrative of a hysteresis comparator.

FIG. 6 illustrates a circuit configuration of the hysteresis comparator 6, which has been known in the art to which the present invention pertains, for which reason the description thereof will be omitted.

A second embodiment according to the present invention will be described with reference to FIGS. 7, wherein a novel phase synchronous circuit is provided.

The novel phase synchronous circuit includes a chopper waveform chopper waveform phase comparator 2a, a first loop filter 3 being electrically connected to the multiplying phase comparator 2, a second loop filter 4 being electrically connected to the first loop filter 3, a voltage control oscillator 5 being electrically connected to the second loop filter 4, an inventor circuit 7 having an input side being electrically connected to the voltage control oscillator 5 and a switching circuit 11 having two input terminals 11a and 11b and a single output terminal 11c. The input terminal 11a is electrically connected to the voltage control oscillator 5. The input terminal 105b is electrically connected to an output terminal of the invertor circuit 7. The output terminal 11c is electrically connected to an output terminal 8 and also to an input side of the chopper waveform phase comparator 2a. An input terminal 1 is also electrically connected to another input of the multiplying phase comparator 2. Further, the novel phase synchronous circuit includes a hysteresis comparator 6 having first and second inputs being electrically connected to an output side of the first loop filter 3 and an output side of the second loop filter 4 respectively. In the initial state, the switching circuit 11 has an electrical connection between the input terminal 11a and the output terminal 11c.

Figure 7:
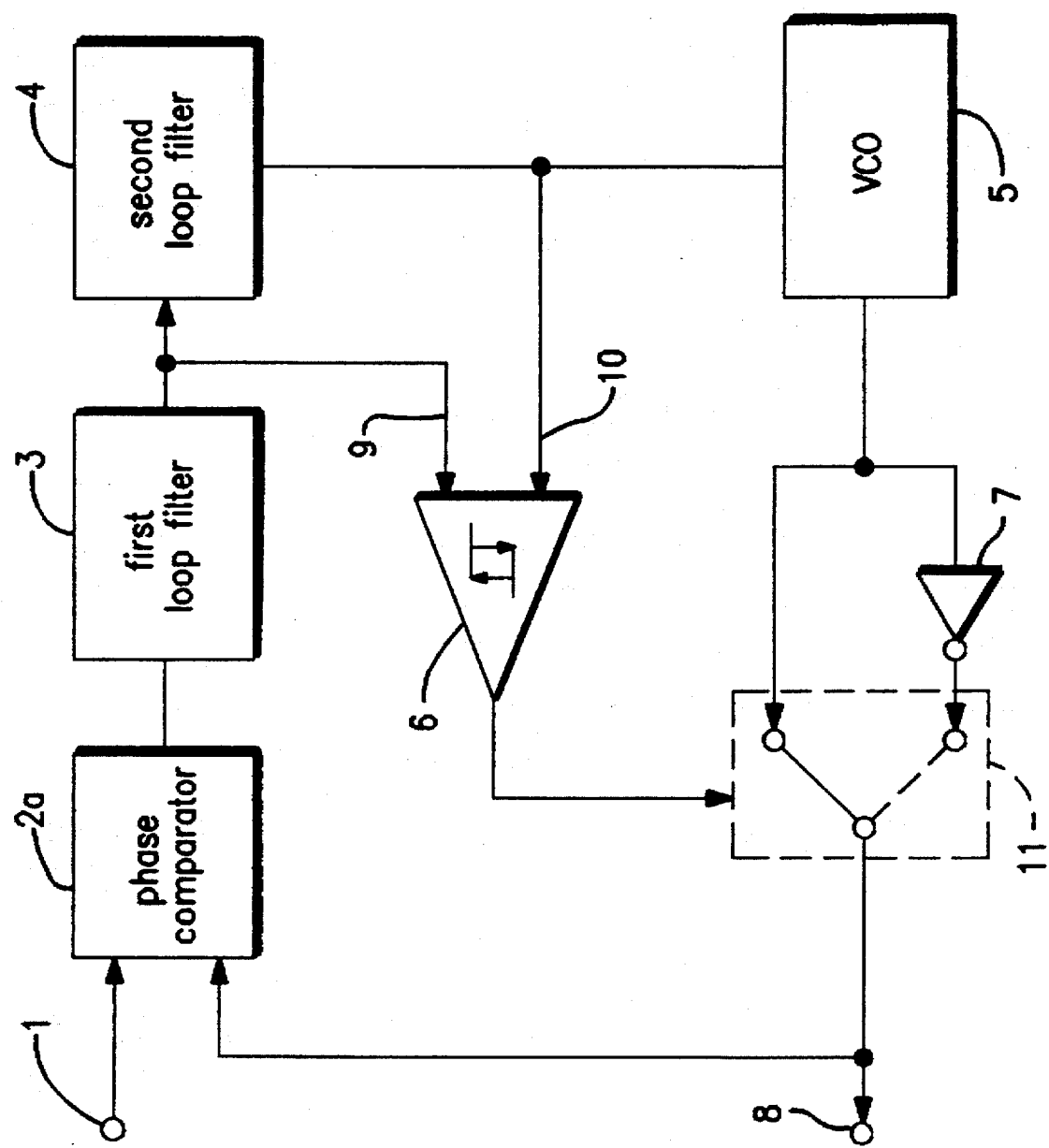
FIG. 7 is a circuit block diagram illustrative of a novel phase synchronous circuit in a second embodiment according to the present invention.
Figure 8:
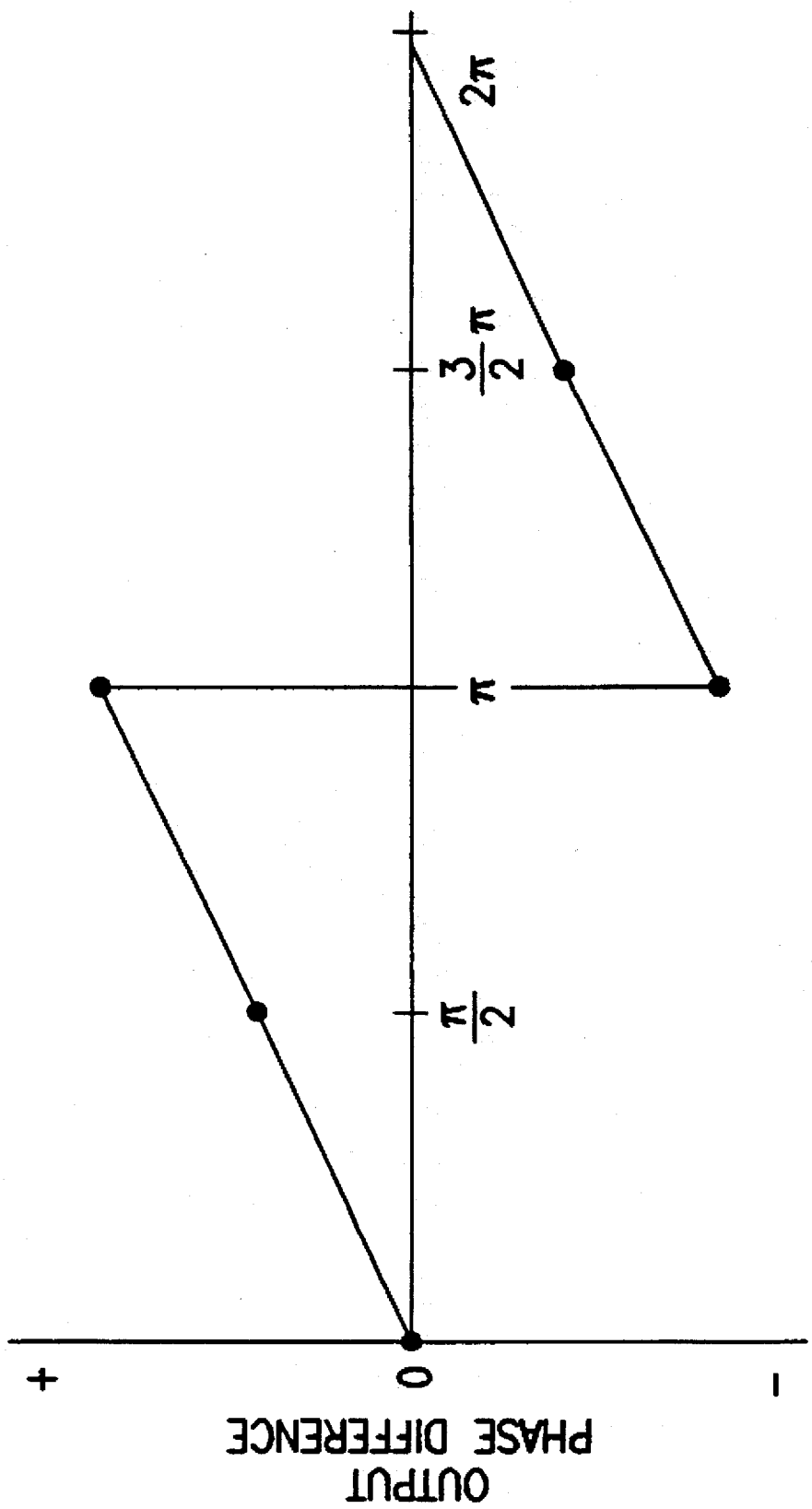
FIG. 8 is a diagram illustrative of an output property over phase differences of a chopper waveform phase comparator in FIG. 7.

FIG. 8 is illustrative of an output property over phase differences of the above chopper waveform phase comparator 2a in FIG. 7.

Figure 9:
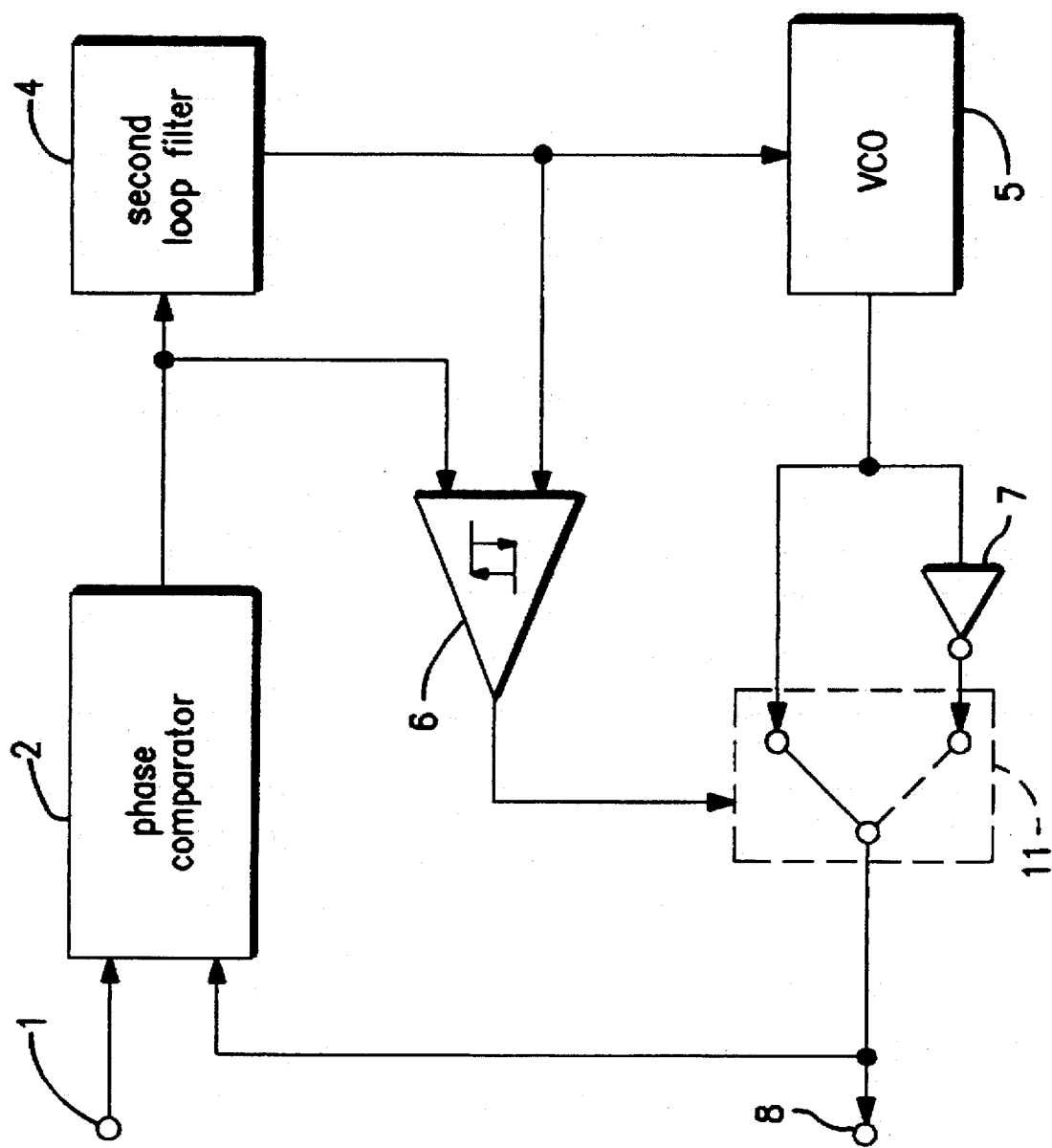
FIG. 9 is a circuit block diagram illustrative of a novel phase synchronous circuit in a third embodiment according to the present invention.

A third embodiment according to the present invention will be described with reference to FIGS- 9, wherein a novel phase synchronous circuit is provided.

The novel phase synchronous circuit includes a multiplying phase comparator 2, a loop filter 4 being electrically connected to the multiplying phase comparator 2, a voltage control oscillator 5 being electrically connected to the loop filter 4, an inventor circuit 7 having an input side being electrically connected to the voltage control oscillator 5 and a switching circuit 11 having two input terminals 11a and 11b and a single output terminal 11c. The input terminal 11a is electrically connected to the voltage control oscillator 5. The input terminal 105b is electrically connected to an output terminal of the invertor circuit 7. The output terminal 11c is electrically connected to an output terminal 8 and also to an input side of the multiplying phase comparator 2. An input terminal 1 is also electrically connected to another input of the multiplying phase comparator 2. Further, the novel phase synchronous circuit includes a hysteresis comparator 6 having first and second inputs being electrically connected to an input side and an output side of the loop filter 4 respectively. In the initial state, the switching circuit 11 has an electrical connection between the input terminal 11a and the output terminal 11c.

Figure 10:
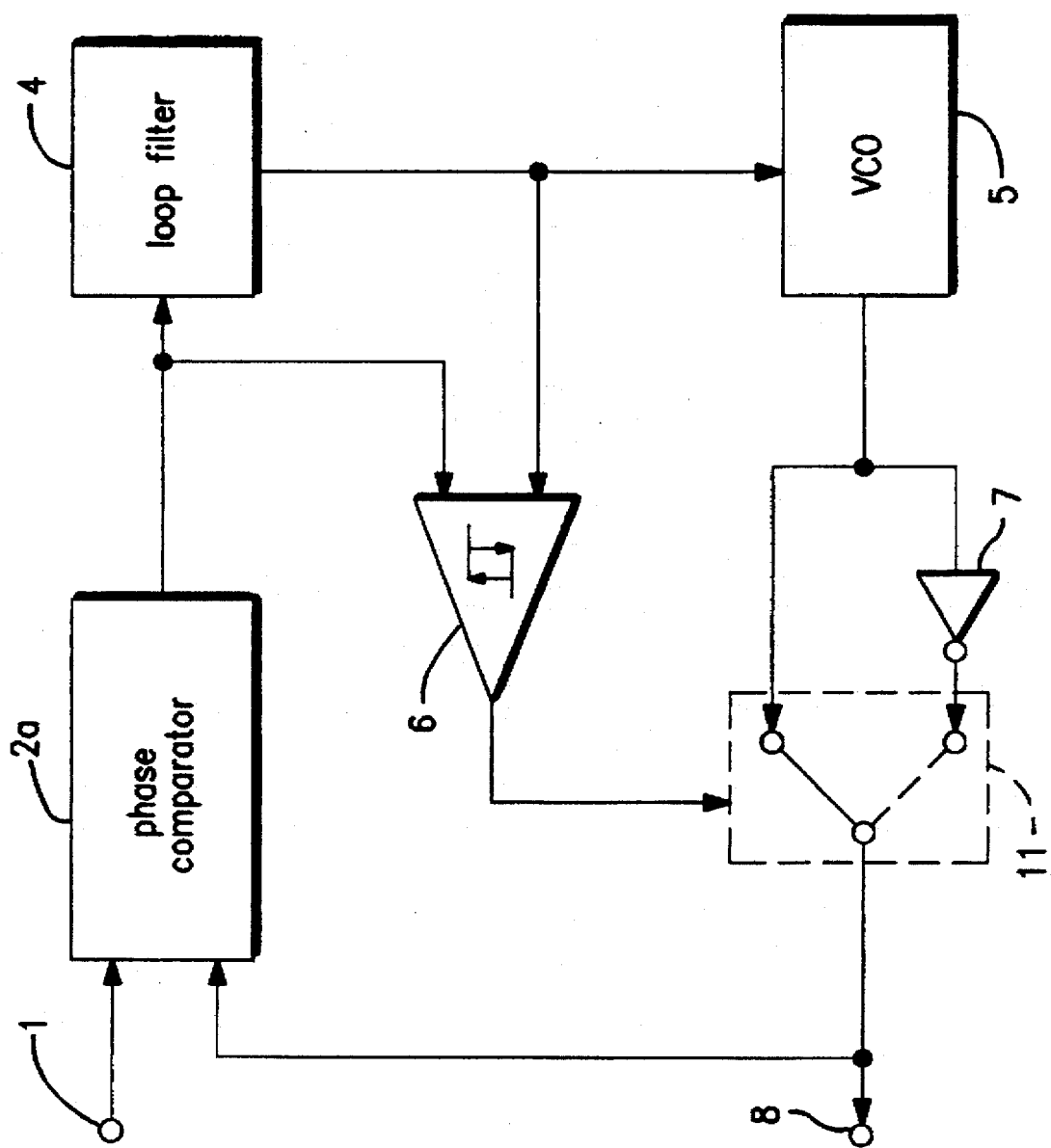
FIG. 10 is a circuit block diagram illustrative of a novel phase synchronous circuit in a fourth embodiment according to the present invention.

A fourth embodiment according to the present invention will be described with reference to FIGS. 10, wherein a novel phase synchronous circuit is provided.

The novel phase synchronous circuit includes a multiplying phase comparator 2, a loop filter 4 being electrically connected to the chopper waveform phase comparator 2a, a voltage control oscillator 5 being electrically connected to the loop filter 4, an inventor circuit 7 having an input side being electrically connected to the voltage control oscillator 5 and a switching circuit 11 having two input terminals 11a and 11b and a single output terminal 11c. The input terminal 11a is electrically connected to the voltage control oscillator 5. The input terminal 105b is electrically connected to an output terminal of the invertor circuit 7. The output terminal 11c is electrically connected to an output terminal 8 and also to an input side of the chopper waveform phase comparator 2a. An input terminal 1 is also electrically connected to another input of the chopper waveform phase comparator 2a. Further, the novel phase synchronous circuit includes a hysteresis comparator 6 having first and second inputs being electrically connected to an input side and an output side of the loop filter 4 respectively. In the initial state, the switching circuit 11 has an electrical connection between the input terminal 11a and the output terminal 11c.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A phase synchronous circuit comprising:
   a phase comparator;
   a first loop filter being electrically connected to the phase comparator;
   a second loop filter being electrically connected to the first loop filter;

a voltage control oscillator being electrically connected to the second loop filter;

an invertor circuit having an input side being electrically connected to the voltage control oscillator;

a switching circuit having two input terminals and a single output terminal, the input terminals being electrically connected to the voltage control oscillator, the input terminals being electrically connected to an output terminal of the invertor circuit, the output terminal being electrically connected to an output terminal and also to an input side of the phase comparator;

an input terminal being also electrically connected to another input of the phase comparator; and a hysteresis comparator having first and second inputs being electrically connected to an output side of the first loop filter and an output side of the second loop filter respectively.

2. The phase synchronous circuit as claimed in claim 1, wherein said phase comparator comprises a multiplying phase comparator.

3. The phase synchronous circuit as claimed in claim 1, wherein said phase comparator comprises a chopper waveform phase comparator.

4. A phase synchronous circuit comprising:

a phase comparator;

a loop filter being electrically connected to the phase comparator;

a voltage control oscillator being electrically connected to the loop filter;

an invertor circuit having an input side being electrically connected to the voltage control oscillator;

a switching circuit having two input terminals and a single output terminal, the input terminals being electrically connected to the voltage control oscillator, the input terminals being electrically connected to an output terminal of the invertor circuit, the output terminal being electrically connected to an output terminal and also to an input side of the phase comparator;

an input terminal being also electrically connected to another input of the multiplying phase comparator; and a hysteresis comparator having first and second inputs being electrically connected to an input side and an output side of the loop filter respectively.

5. The phase synchronous circuit as claimed in claim 4, wherein said phase comparator comprises a multiplying phase comparator.

6. The phase synchronous circuit as claimed in claim 4, wherein said phase comparator comprises a chopper waveform phase comparator.

* * * * *